Jan. 30, 1968 F. P. ZIEMBA 3,366,850

P-N JUNCTION DEVICE WITH INTERSTITIAL IMPURITY MEANS TO INCREASE THE REVERSE BREAKDOWN VOLTAGE

Filed Sept. 10, 1963

INVENTOR.
FRANCIS P. ZIEMBA
BY Fulwider, Patton, Rieber, Lee, and Utecht
ATTORNEYS 3,366,850

P-N JUNCTION DEVICE WITH INTERSTITIAL IMPURITY MEANS TO INCREASE THE REVERSE BREAKDOWN VOLTAGE

Francis P. Ziemba, Los Angeles, Calif., assignor to Solid State Radiations, Inc., Los Angeles, Calif., a corporation of California Filed Sept. 10, 1963, Ser. No. 307,969
4 Claims. (Cl. 317—234)

This invention relates generally to improvements in semiconductor devices, and more particularly to production of semiconductor devices having p-n junctions capable of withstanding relatively high voltages without breakdown.

In the many fields where solid state physics has been applied, it has been common practice to employ such semiconductor devices as nuclear detector diodes, high voltage rectifiers, transistors, silicon control rectifiers voltage regulator diodes, and the like for a great variety of radiation detection, rectification, amplification and electrical control applications. Although such semiconductor devices have generally served their purpose, they have not always proven entirely satisfactory for all types of service by virtue of their limitations regarding high voltage operation. Such high voltage limitations seriously curtail the range of application of such semiconductor devices, and efforts to date to extend the upper operating voltage limits for these devices have generally proven to be impractical on a large scale basis.

The aforementioned high voltage limitations of various semiconductor devices has been ascribed to the problem of local electrical breakdown at the zone where a p-n semiconductor junction, having a high voltage impressed across the junction, is exposed to the contaminating effects of the atmosphere. Such bulk breakdown in semiconductors takes place only at extremely high electrical field intensities, e.g., approximately $10^5$ volts/cm. in silicon. By using increasingly higher resistivity materials, the electric field intensity in the bulk material of the semiconductor device can be reduced below such critical values for even extremely high applied voltages. However, the latter approach has its drawbacks, since raising the resistivity of the bulk semiconductor material inherently means reducing the quantity of impurities in the bulk material, with the direct result that the exposed zone of the p-n junction is rendered even more susceptible to contamination by the atmosphere. Such contamination gives rise to points of lowered resistivity on the surface of the semiconductor device and/or causes inversion of the semiconductor material. In either case, microscopic avalanche breakdowns occur at local points and increase the reverse current through the p-n junction. In the limiting case, such electrical breakdown restricts the level of voltages which can be applied to the semiconductor device.

Various approaches have been tried by workers in the art, with only limited success, in attempting to overcome such voltage limitation difficulties encountered with semiconductor devices. These approaches have included the use of ultra-clean techniques in fabricating and packaging semiconductor devices, the use of various oxide treatments, and the application of varnishes, resins or encapsulants selected to reduce contamination of the surface of the semi-conductor material. In spite of such techniques, however, diode junctions in silicon have still been limited to approximately 400 volts of collector voltage. In this connection, high resistivity diodes for nuclear detection have generally been limited to upper operating voltage levels of 1000 volts or less.

Those concerned with the development of semi-conductor devices have long recognized the need for an extremely effective, yet practical approach to the production of semiconductor p-n junction devices capable of withstanding higher levels of applied voltage. The present invention fulfills this need.

Accordingly, it is an object of the present invention to provide new and improved semiconductor devices which overcome the above and other disadvantages of the prior art.

Another object is to provide semiconductor junctions capable of withstanding higher applied voltages without electrical breakdown.

A further object of the invention is the provision of a method for producing semiconductor devices having p-n junctions capable of operating at greater levels of impressed voltage.

Still another object is to provide a relatively simple, yet highly reliable means for efficiently imparting high voltage operating characteristics to semiconductor devices.

Yet another object of the present invention is the provision of new and improved high voltage semiconductor devices utilizing interstitial dopants at prescribed locations within the lattice structure of a semiconductor device to provide a highly graded p-n junction at the zone where the junction is exposed to a contaminating atmosphere.

The above and other objects and advantages of this invention will become apparent from the following description, when taken in conjunction with the accompanying drawings of illustrative embodiments thereof, and wherein.

Figure 1:
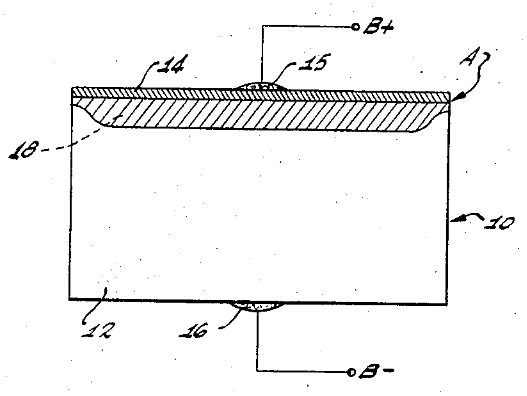
FIGURE 1 is a transverse sectional view through a conventional semiconductor diode having a p-n junction, and also schematically illustrates the shape of the depletion region with a potential difference across the diode.

Referring now to the drawings, and particularly to FIGURE 1 thereof, a conventional semiconductor diode 10 is illustrated for the purpose of pointing out the high voltage deficiencies of conventional p-n junction techniques. The semiconductor device 10 includes a relatively thick base layer 12 of high resistivity p-type material having on one surface thereof a thin layer of relatively low resistivity n-type material produced by diffusion, alloying, epitaxial growth or the like.

The p-type layer 12 and n-type layer 14 generally comprise a bulk semiconductor material, such as germanium or silicon, containing selected impurities which impart the desired n- or p-type characteristics to the material. These characteristics are generally obtained by using impurities which are replacement acceptors or replacement donors, i.e., materials which replace the silicon or germanium atoms of the pure bulk semiconductor material, of which phosphorus is a common n-type replacement impurity, and boron and aluminum are common p-type replacement impurities.

A pair of electrically conducting contacts 15, 16 are affixed to opposite face surfaces of the semiconductor device 10, so that an appropriate voltage may be applied across the diode. Upon the application of such a reverse bias, i.e., positive potential at the n-type layer 14, a depletion region 18 is established, all charge carriers being swept out of the depletion region to create the usual neutral zone. The result is the characteristic potential barrier of a reverse bias diode, as shown by the boundary shape of the depletion region 18 in FIGURE 1.

Contaminants from the atmosphere in contact with the p-n junction surface a zone A in FIGURE 1, such contamination typically taking the form of a low resistivity p-type material ($SiO_2$) spreading over the end surface of the n-type layer 14, produce a local high electric field intensity about the exposed circumference of the p-n junction, and this high field intensity causes the avalanche breakdowns previously described.

Figure 2:
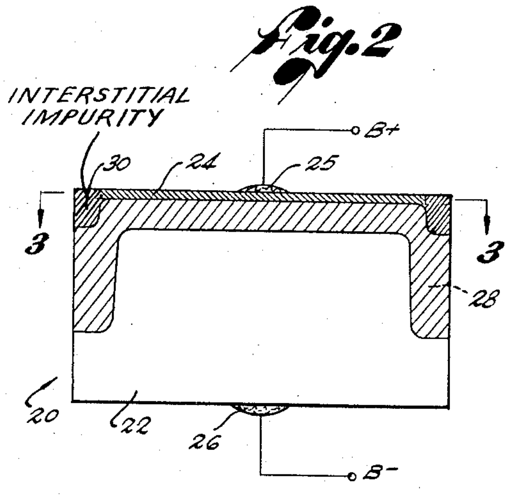
FIGURE 2 is a view similar to FIGURE 1, but for a semiconductor diode structure in accordance with the present invention.

FIGURE 2 illustrates the structure of an improved semiconductor device 20 in accordance with the invention, and the reference numerals 22–28 designate parts or elements in FIGURE 2 corresponding to like parts designated by the reference numerals 12–18 in FIGURE 1.

It will be noted in FIGURE 2 that the depletion region 28 has a boundary configuration indicating that the electric field intensity about the outer circumference of the exposed junction surface is actually less than the electric field intensity across remaining portions of the junction. Hence, the semiconductor device 20 of FIGURE 2 is not as readily susceptible to electrical breakdown by virtue of exposed junction surface contamination, and the device 20 can withstand much higher applied voltages.

Figures 3, 4, 5:
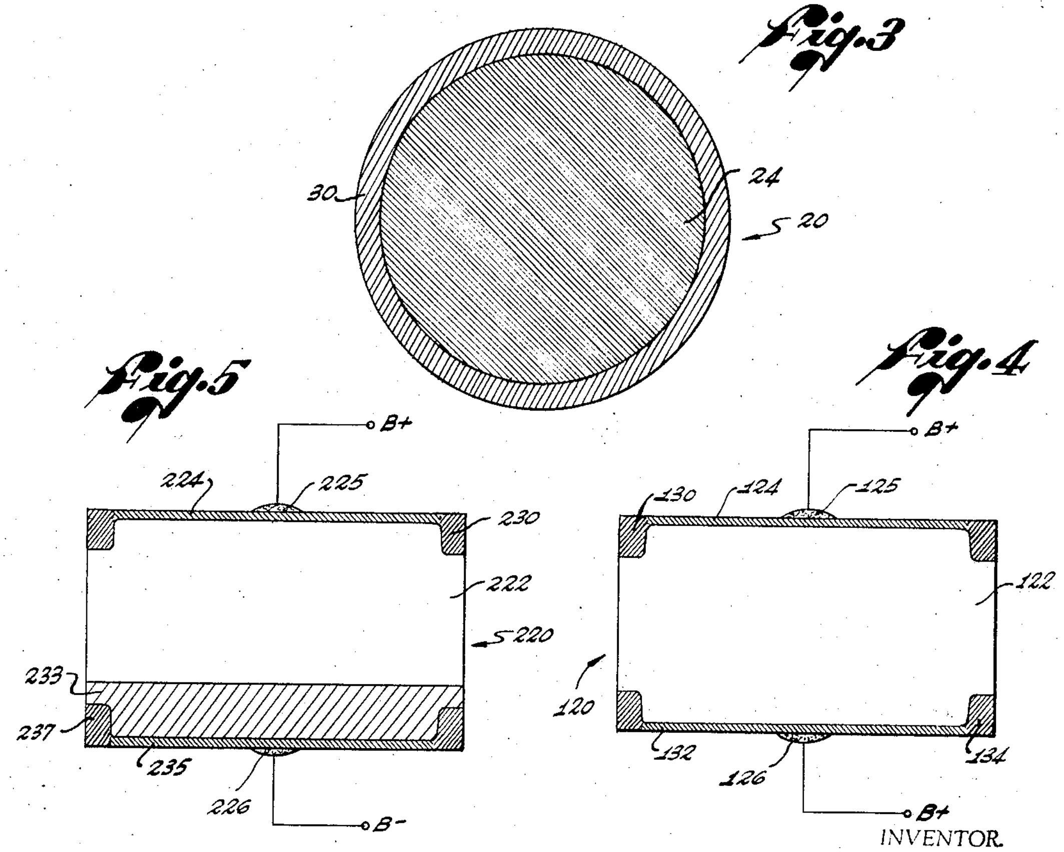
FIGURE 3 is a sectional view, taken along the lines 3—3 in FIGURE 2, and illustrates the ring-like configuration of the interstitial donor material diffused into the surface of the semiconductor device.
FIGURE 4 is a transverse sectional view through a semiconductor device, and illustrates the application of the present invention to a three layer n-p-n device.
FIGURE 5 is a view similar to FIGURE 4, but illustrating the invention as applied to a four layer n-p-n-p semiconductor device.

Referring to FIGURES 2 and 3, it will be observed that the aforementioned desirable results have been obtained by diffusing a layer of n-type interstitial impurity into the base semiconductor material in the vicinity of the exposed p-n junction surface. This diffusion of the n-type interstitial impurity is carried out under the application of high temperature and high electrical field intensity to produce a highly compensated region in the form of a ring surrounding the depletion region 28 and n-type layer 24. Such n-type and p-type interstitial impurities differ from the n-type and p-type replacement impurities previously described in that the interstitial impurity atoms or ions are considerably more mobile than the replacement impurity atoms or ions. In this regard, whereas replacement impurities actually replace atoms of the pure bulk semiconductor material in the lattice structure, interstitial impurities merely diffuse between the atoms of semiconductor material. Suitable examples of n-type interstitial impurities are lithium, copper, and nickel, and zinc is an example of a p-type interstitial impurity.

In practicing the invention, the interstitial impurity used is of the same type, i.e., "n" or "p" as the layer of replacement impurity material through which the interstitial impurity is diffused. For example, in FIGURE 2 with a surface layer 24 of n-type material, the interstitial impurity 30 diffused through the layer 24 would also be an n-type material. On the other hand, if the layer 24 was a p-type layer, a p-type interstitial impurity 30 would be used.

In a typical embodiment of the invention, such as that illustrated in FIGURES 2 and 3, the base p-type layer 22 may be 300 ohm cm. float zone silicon with a phosphorus diffusion upon one surface, producing the n-type layer 24 having a number of orders of magnitude lower resistivity than the base. The interstitial impurity 30 may be lithium which is diffused into the semiconductor surface in a ring-shaped region around the edges of the p-n junction. Diffusion is accomplished by heating the structure to approximately 150° C., with a sufficiently high reverse bias voltage to cause appreciable movement and penetration of the lithium ions into the lattice structure. The result is an extremely well compensated, low field intensity region which is capable of withstanding high voltages without electrical breakdown.

One explanation for the high voltage capability of p-n junctions produced in accordance with the present invention is that contaminating surface impurities are compensated by the drifting of interstitial impurities toward or away from the contamination sites, thus effectively preventing formation of local areas of high electrical field intensity. Typical diodes fabricated in accordance with the aforementioned technique may exhibit a reverse breakdown voltage of less than 25 volts prior to the application of a compensating ring of diffused and drifted lithium. However, following the application of this compensating interstitial impurity ring, the reverse breakdown voltage of the same diodes may well exceed 1500 volts, without the special precautions normally required to process high resistivity diodes. Diodes produced in accordance with the invention also display excellent noise and resolution characteristics when used as nuclear detectors. Moreover, the collection time of charge carriers within such semiconductor devices, by virtue of the higher voltages, is extremely short, resulting in excellent high frequency characteristics.

The semiconductor devices produced in accordance with the present invention may be further enhanced by the inclusion of selected amounts of impurities such as oxygen, which have been shown to fix the normally mobile interstitial impurities in the positions at which they come to rest. The use of such impurities may prove valuable in stabilizing the semiconductor devices against any undesirable additional penetration of the interstitial impurity during normal operation.

FIGURE 4 illustrates the invention as applied to a three layer n-p-n semiconductor device 120. The reference numerals 122–130 in FIGURE 4 refer to like elements as designated by the reference numerals 22–30 for the semiconductor device 20 in FIGURE 2. The primary distinction in FIGURE 4 is the inclusion of an additional n-type layer 132, and compensation of the p-n junction produced thereby by diffusion of an additional ring of n-type interstitial impurity into the semiconductor device to protect this latter junction against breakdown.

FIGURE 5 shows a four layer n-p-n-p semiconductor device 220, wherein the reference numerals 222–230 designate like parts as the reference numerals 22–30 in FIGURE 2. A primary distinction of the device shown in FIGURE 5 is the inclusion of additional n-type and p-type layers 233, 235, respectively. The p-n junction between these latter layers is protected against high voltage electrical breakdown by a compensating ring 237 of an appropriate p-type interstitial impurity, in accordance with the present invention.

It will be apparent from the foregoing that, while particular forms of my invention have been illustrated and described, various modifications can be made without departing from the spirit and scope of my invention. Accordingly, I do not intend that my invention be limited, except as by the appended claims.

I claim:

1. A high voltage semiconductor junction device, comprising:

a body of semiconductor material having first and second opposing surfaces and a body surface extending between said opposing surfaces;

a first layer of one conductivity type semiconductor material adjacent said first opposing surface;

a second layer of opposite conductivity type semiconductor material contiguous to said first layer to form a p-n junction therewith between said opposing surfaces, said p-n junction having an exposed peripheral end surface at said body surface;

means for increasing the reverse breakdown voltage of said p-n junction against electrical breakdown, said means including an interstitial impurity extending into said semiconductor body from said first opposing surface through said first layer and only partially into said second layer substantially only at said exposed peripheral end surface of said p-n junction;

and electrical contacts attached to said device on each of said opposing surfaces respectively.

2. A semiconductor device as set forth in claim 1, wherein said first layer is an n-type layer of semiconductor material containing an n-type replacement impurity, and said interstitial impurity is an n-type impurity extending through said n-type layer.

3. A semiconductor device as set forth in claim 1, wherein said first layer is a p-type layer of semiconductor material containing a p-type replacement impurity, and said interstitial impurity is a p-type impurity extending through said p-type layer.

4. A semiconductor device as set forth in claim 2 wherein said interstitial impurity is lithium.

References Cited

UNITED STATES PATENTS

| | | | |
|---|---|---|---|
| 2,899,344 | 8/1959 | Atalla et al. | 148—105 |
| 3,176,151 | 3/1965 | Atalla et al. | 307—88.5 |
| 3,226,612 | 12/1965 | Haenichen | 317—234 |
| 2,813,233 | 11/1957 | Shockley | 317—235 |
| 2,957,789 | 3/1959 | Pell | 148—1.5 |
| 2,984,890 | 5/1961 | Hambor | 29—25.3 |
| 3,152,024 | 10/1964 | Diedrich | 148—177 |

FOREIGN PATENTS

| | | |
|---|---|---|
| 1,279,484 | 11/1961 | France. |

OTHER REFERENCES

IBM Technical Disclosure Bulletin, January 1963, p. 94.

JOHN W. HUCKERT, *Primary Examiner.*

J. R. SHEWMAKER, *Assistant Examiner.*